US008162203B1

(12) United States Patent
Gruber et al.

(10) Patent No.: US 8,162,203 B1

(45) Date of Patent: Apr. 24, 2012

(54) SPHERICAL SOLDER REFLOW METHOD

(75) Inventors: Peter A. Gruber, Mohegan Lake, NY (US); Jae-Woong Nah, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/030,594

(22) Filed: Feb. 18, 2011

(51) Int. Cl.
*B23K 31/02* (2006.01)

(52) U.S. Cl. ................... 228/256; 228/180.22; 228/246; 228/260

(58) Field of Classification Search ........................ None
See application file for complete search history.

(56) References Cited

U.S. PATENT DOCUMENTS 4,412,642 A * 11/1983 Fisher, Jr. .................. 228/173.1
5,244,143 A * 9/1993 Ference et al. ........... 228/180.21
5,653,783 A 8/1997 Ohzeki
5,971,058 A * 10/1999 Bolde et al. ................... 164/130
6,029,882 A * 2/2000 Bolde et al. ................... 228/254
6,231,333 B1 * 5/2001 Gruber et al. ................. 425/546
6,425,518 B1 * 7/2002 Gruber et al. ................. 228/256
6,446,878 B1 9/2002 Chandra et al.
6,461,136 B1 * 10/2002 Gruber et al. ................. 425/110
6,484,927 B1 * 11/2002 Adriance et al. .............. 228/245
6,527,158 B1 * 3/2003 Brouillette et al. ............. 228/33
7,348,270 B1 * 3/2008 Danovitch et al. ............ 438/613
7,506,794 B1 * 3/2009 Cordes et al. ............ 228/180.22
2002/0125402 A1 * 9/2002 Cordes et al. ................. 249/119
2005/0109823 A1 * 5/2005 Gruber et al. ................. 228/246
2005/0263571 A1 * 12/2005 Belanger et al. .............. 228/256
2006/0035454 A1 * 2/2006 Belanger et al. .............. 438/616
2006/0292753 A1 * 12/2006 Takahashi et al. ............ 438/127
2007/0178625 A1 * 8/2007 Danovitch et al. ............ 438/108
2007/0246516 A1 * 10/2007 Cordes et al. ............ 228/180.22
2008/0048008 A1 * 2/2008 Schultz .................... 228/180.22
2008/0156849 A1 * 7/2008 Bouchard et al. ............. 228/125
2008/0164609 A1 7/2008 Gruber et al.
2008/0185118 A1 * 8/2008 Schultz ........................... 164/14
2008/0272177 A1 * 11/2008 Cordes et al. ................... 228/33
2008/0302860 A1 * 12/2008 Biggs et al. ................ 228/179.1
2009/0020590 A1 * 1/2009 Knickerbocker et al. ..... 228/176
2009/0039142 A1 * 2/2009 Bezama et al. ............... 228/249
2009/0072392 A1 * 3/2009 Dang et al. ..................... 257/737
2009/0120999 A1 * 5/2009 Indyk et al. ................... 228/245
2009/0179019 A1 * 7/2009 Cohen et al. ............. 219/121.85
2009/0181223 A1 * 7/2009 Buchwalter et al. .......... 428/198
2009/0183849 A1 * 7/2009 Budd et al. ....................... 164/61
2009/0266972 A1 * 10/2009 Goldmann .................... 249/119
2009/0301685 A1 * 12/2009 Gruber et al. ................. 164/303
2009/0302096 A1 * 12/2009 Budd et al. ..................... 228/246
2009/0308308 A1 * 12/2009 Gruber et al. ................. 118/200

(Continued)

OTHER PUBLICATIONS

P.A. Gruber, et al., "Low-cost wafer bumping," IBM J. Res. & Dev., vol. 49, No. 4/5 (2005), pp. 621-639.

*Primary Examiner* — Kiley Stoner

(74) *Attorney, Agent, or Firm* — Connolly Bove Lodge & Hutz LLP

(57) ABSTRACT

The present disclosure relates to methods of making solder balls having a uniform size. More particularly, the disclosure relates to improved solder ball formation processes that prevent or reduce bridging/merging of two or more solder balls during reflow. The processes of the instant disclosure are desirable because they do not require a sifting step to obtain uniformly-sized solder balls.

16 Claims, 10 Drawing Sheets

U.S. PATENT DOCUMENTS

2010/0001045 A1* 1/2010 Cordes et al. ................ 228/208
2010/0116871 A1* 5/2010 Gruber et al. ................ 228/244
2010/0224670 A1* 9/2010 Buchwalter et al. .......... 228/102
2010/0252225 A1* 10/2010 Schultz ........................ 164/303
2011/0092066 A1* 4/2011 Mackay ........................ 438/616
2011/0127312 A1* 6/2011 Gruber et al. .................. 228/33
2011/0203762 A1* 8/2011 Budd et al. ...................... 164/61
2011/0233262 A1* 9/2011 Buchwalter et al. ........... 228/33
2011/0233762 A1* 9/2011 Gruber et al. ................ 257/737
2011/0237030 A1* 9/2011 Gruber et al. ................ 438/111

* cited by examiner

SPHERICAL SOLDER REFLOW METHOD

TECHNICAL FIELD

The present disclosure relates to methods of making solder balls having a uniform size. More particularly, the disclosure relates to improved solder ball formation processes that prevent or reduce bridging of two or more solder balls during injection molding processes. The solder balls produced by the instantly disclosed methods are used to electrically connect integrated circuits.

BACKGROUND OF THE DISCLOSURE

Semiconductor chips can be mounted in a flip-chip configuration, wherein the chips contain solder balls between integrated circuit (IC) devices and chip carriers. The solder balls provide an electrical connection and bond between a chip contact location and a substrate contact location. It is important that the size of the solder balls are uniform in order to ensure that all of the chip contact locations will be electrically interconnected to a corresponding substrate contact location.

Various technologies exist for depositing solder bumps on to IC devices at the wafer level, including, for example, evaporation, electroplating, screen-printing, jetting, ball dropping, and Controlled Collapse Chip Connect New Process (i.e., C4NP). These deposition methods are often referred to as solder wafer bumping or C4 wafer bumping. Originally, solder wafer bumping was accomplished by evaporating both the ball-limiting metallurgy (BLM) and solder through mask holes in an array fashion onto the wafer surface. As the demand for higher I/O density, and lower cost of flip-chip interconnections has increased, however, other deposition methods have been developed. For example, ball drop methods, used to make micro-size solder balls, have recently gained attention in the industry because these methods allow for flexibility in the solder alloys used and finer pitch applications. Indeed, in U.S. Pat. No. 6,517,602, Sato et al. disclose a method of forming solder balls by using a droplet spraying method. This method enables production of micro-sized solder balls, but does not enable formation of solder balls having diameters less than 50 microns due to nozzle-size limitations. Furthermore, the process described by Sato et al. does not produce uniform solder balls, and thus a secondary sorting process is needed to obtain solder balls of the same size.

More recently, injection molded solder (IMS) processing has been used as a cost-effective solder wafer bumping method. While solder balls formed by IMS are usually more uniform in size than those produced by "ball drop" techniques, the uniformity of the solder balls can be lost if the solder balls escape from the mold plate and are allowed to merge with one another after reflowing occurs. Therefore, it would be desirable to develop an IMS process wherein merging or bridging of the solder balls is reduced or prevented.

SUMMARY OF THE DISCLOSURE

The present disclosure provides IMS methods that reduce and/or prevent bridging of two or more solder balls during reflow of the solder. The IMS methods of the instant disclosure provide cost-effective processes of making two or more solder balls that are uniform in size.

A first aspect of the present disclosure is a method of preventing or reducing bridging of two or more solder balls during an injection molded soldering process comprising:

(A) obtaining a mold plate comprising at least two cavities on a top side of the mold plate, and at least one non-recessed space running between the at least two cavities, wherein the at least one non-recessed space is co-planar to the top side of the mold plate, and extends through an entire length of the mold plate;

(B) obtaining a coverplate comprising at least two recesses on an underside of the coverplate, and at least one non-recessed space running between the at least two recesses, wherein the at least one non-recessed space is co-planer to the underside of the coverplate, and extends through an entire length of the coverplate;

(C) filling the at least two cavities with a molten solder;

(D) cooling the molten solder to a temperature that is below about ½ of the solder's melting point to form a solidified solder;

(E) forming a gap between a top of the mold plate and the underside of the coverplate by positioning the at least two recesses of the coverplate over a top of the at least two cavities of the mold plate and aligning the recesses of the coverplate, at the cavity scale, with the cavities of the mold plate; and (F) reflowing the solidified solder in an oxide-reducing environment to form at least two solder balls, wherein a height of the gap between the top of the mold plate and the underside of the coverplate is about ⅓ to about ¾ of a diameter of each of the at least two solder balls.

The height of the gap between the top of the mold plate and the underside of the coverplate is typically about ⅓ to about ¾ of a diameter of each of the at least two solder balls, is more typically about ½-⅔ of a diameter of each of the at least two solder balls, and is most typically about ½ of a diameter of each of the at least two solder balls.

Reflow occurs in an oxide-reducing environment at temperatures above the solder melting point, and can be accomplished using either liquid or gaseous flux. After reflow is complete, the coverplate is separated from the mold plate and the solder balls are then removed from the cavities. The shape of each of the cavities of the mold plate is typically round, hemispherical, pyramidal, cubic, hexahedron, octagonal, or cross-shaped. The mold plate is usually formed from a glass, metal, graphite, silicon, ceramic, or polymer material. Furthermore, the mold plate and/or coverplate may comprise at least one gas vent channel that extends through a middle of the non-recessed space running between the at least two cavities and/or the at least two recesses. When present, the gas vent channel extends through the entire length of the mold plate and/or coverplate.

A second aspect of the disclosure is a method of preventing or reducing bridging of two or more solder balls during an injection molded soldering process comprising:

(A) obtaining a mold plate comprising at least two cavities on a top side of the mold plate, and at least one non-recessed space running between the at least two cavities, wherein the at least one non-recessed space is co-planar to the top side of the mold plate, and extends through an entire length of the mold plate, and wherein the at least two cavities have a uniform depth;

(B) obtaining a coverplate comprising at least two recesses on an underside of the coverplate, and at least one non-recessed space running between the at least two recesses, wherein the at least one non-recessed space is co-planer to the underside of the coverplate, and extends through an entire length of the coverplate, and wherein the coverplate is a flux plate and a depth of the at least two recesses is approximately equivalent to the depth of the at least two cavities of the mold plate;

(C) filling the at least two cavities with a molten solder;

(D) cooling the molten solder to a temperature that is below about ½ of the solder's melting point to faun a solidified solder;

(E) filling the at least two recesses in the underside of the coverplate with flux;

(F) fanning a solvent access gap by placing a spacer between the top side of the mold plate and the underside of the coverplate, and then aligning the recesses of the coverplate, at the cavity scale, with the cavities of the mold plate; and (G) reflowing the solidified solder to form at least two solder balls, wherein a height of the spacer is about ⅓ to about ¾ of a diameter of each of the at least two solder balls.

The height of the spacer is typically about ⅓ to about ¾ of a diameter of each of the at least two solder balls, is more typically about ½-⅔ of a diameter of each of the at least two solder balls, and is most typically about ½ of a diameter of each of the at least two solder balls.

Reflow occurs in an oxide-reducing environment at temperatures above the solder melting point, and, in this aspect of the disclosure, is accomplished using a liquid flux. After reflow is complete, the coverplate is separated from the mold plate and the solder balls are removed from the cavities. The shape of each of the cavities of the mold plate is typically round, hemispherical, pyramidal, cubic, hexahedron, octagonal, or cross-shaped. The mold plate is usually formed from a glass, metal, graphite, silicon, ceramic, or polymer material. Furthermore, the mold plate and/or coverplate may comprise at least one gas vent channel that extends through a middle of the non-recessed space running between the at least two cavities and/or the at least two recesses. When present, the gas vent channel extends through the entire length of the mold plate and/or coverplate.

The spacer is typically placed either peripherally along the edges of the top side of the mold plate and the edges of the underside of the coverplate, or along the non-recessed space separating the arrays of cavities and recesses in the mold plate and coverplate, respectively. If the spacer is placed peripherally along the edges of the mold plate and coverplate, the spacer has breaks along its length so that the volume defined by the facing surfaces of the mold and coverplates, as well as the peripheral spacer, is never sealed. These breaks permit flux solvents to penetrate into the cavity area and remove flux residues therefrom.

The second aspect of the present disclosure may further comprise removing a flux residue formed in the at least two cavities of the mold plate after reflowing, wherein removing the flux residue comprises contacting the flux residue with a solvent by infusing the solvent by capillary action through the solvent access gap. The flux residue is removed after reflow but before the coverplate is separated from the mold plate. The reflowed solder balls remain arrayed in the cavity plate until after the flux residue is removed, and then they are gathered in a cleaning tank or collection sieve through which the cleaning solution was discarded.

A third aspect of the present disclosure is a method of preventing or reducing bridging of two or more solder balls during an injection molded soldering process comprising:

(A) obtaining a mold plate comprising at least two cavities on a top side of the mold plate, and at least one non-recessed space running between the at least two cavities, wherein the at least one non-recessed space is co-planar to the top side of the mold plate, and extends through an entire length of the mold plate;

(B) obtaining a coverplate comprising at least one recess on an underside of the coverplate, wherein the recess is sufficiently large to cover more than one of the at least two cavities of the mold plate and the non-recessed space between the at least two cavities;

(C) filling the at least two cavities with a molten solder;

(D) cooling the molten solder to a temperature that is below about ½ of the solder's melting point to form a solidified solder;

(E) forming a gap between a top of the mold plate and the underside of the coverplate by positioning the at least one recess of the coverplate over a top of the at least two cavities of the mold plate and aligning the recesses of the coverplate, at the matrix scale, with the cavities of the mold plate; and (E) reflowing the solidified solder to form at least two solder balls, wherein a height of the gap between the top of the mold plate and the underside of the coverplate is about ⅓ to about ¾ of a diameter of each of the at least two solder balls.

The height of the gap between the top of the mold plate and the underside of the coverplate is typically about ⅓ to about ¾ of a diameter of each of the at least two solder balls, is more typically about ½-⅔ of a diameter of each of the at least two solder balls, and is most typically about ½ of a diameter of each of the at least two solder balls.

Reflow occurs in an oxide-reducing environment at temperatures above the solder melting point, and can be accomplished using either liquid or gaseous flux. After reflow is complete, the coverplate is separated from the mold plate and the solder balls are then removed from the cavities and collected. The shape of each of the cavities of the mold plate is typically round, hemispherical, pyramidal, cubic, hexahedron, octagonal, or cross-shaped. The mold plate is usually formed from a glass, metal, graphite, silicon, ceramic, or polymer material. Furthermore, the mold plate may comprise at least one gas vent channel that extends through a middle of the non-recessed space running between the at least two cavities. When present, the gas vent channel extends through the entire length of the mold plate.

A fourth aspect of the disclosure is a method of preventing or reducing bridging of two or more solder balls during an injection molded soldering process comprising:

(A) obtaining a mold plate comprising at least two cavities on a top side of the mold plate, and at least one non-recessed space running between the at least two cavities, wherein the at least one non-recessed space is co-planar to the top side of the mold plate, and extends through an entire length of the mold plate, and wherein the at least two cavities have a uniform depth;

(B) obtaining a coverplate comprising at least one recess on an underside of the coverplate, wherein the recess is sufficiently large to cover more than one of the at least two cavities of the mold plate and the non-recessed space between the at least two cavities and a depth of the at least one recess is approximately equivalent to the depth of the at least two cavities of the mold plate, and wherein the coverplate is a flux plate;

(C) filling the at least two cavities with a molten solder;

(D) cooling the molten solder to a temperature that is below about ½ of the solder's melting point to form a solidified solder;

(E) filling the at least one recess in the underside of the coverplate with flux;

(F) forming a solvent access gap by placing a spacer between the top side of the mold plate and the underside of the coverplate, and then aligning the recess of the coverplate, at the matrix scale, with the cavities of the mold plate; and (G) reflowing the solidified solder to form at least two solder balls, wherein a height of the spacer is about ⅓ to about ¾ of a diameter of each of the at least two solder balls.

The height of the spacer is typically about ⅓ to about ¾ of a diameter of each of the at least two solder balls, is more typically about ½-⅔ of a diameter of each of the at least two solder balls, and is most typically about ½ of a diameter of each of the at least two solder balls.

Reflow occurs in an oxide-reducing environment at temperatures above the solder melting point, and, in this aspect of the disclosure, is accomplished using a liquid flux. After reflow is complete, the coverplate is separated from the mold plate and the solder balls are removed from the cavities. The shape of each of the cavities of the mold plate is typically round, hemispherical, pyramidal, cubic, hexahedron, octagonal, or cross-shaped. The mold plate is usually formed from a glass, metal, graphite, silicon, ceramic, or polymer material. Furthermore, the mold plate may comprise at least one gas vent channel that extends through a middle of the non-recessed space running between the at least two cavities. When present, the gas vent channel extends through the entire length of the mold plate.

The spacer is typically placed peripherally along the edges of the top side of the mold plate and the edges of the underside of the coverplate. The spacer has breaks along its length so that the volume defined by the facing surfaces of the mold and coverplate, as well as the peripheral spacer, is never sealed. These breaks permit flux solvents to penetrate into the cavity area and remove flux residues therefrom.

The fourth aspect of the present disclosure may further comprise removing a flux residue formed in the at least two cavities of the mold plate after reflowing, wherein removing the flux residue comprises contacting the flux residue with a solvent by infusing the solvent by capillary action through the solvent access gap. The flux residue is removed after reflow but before the coverplate is separated from the mold plate. The reflowed solder balls remain arrayed in the cavity plate until after the flux residue is removed, and then they are gathered in a cleaning tank or collection sieve through which the cleaning solution was discarded.

Yet a fifth aspect of the present disclosure relates to a method of preventing or reducing bridging of two or more solder balls during an injection molded soldering process comprising:

(A) obtaining a mold plate comprising at least two cavities on a top side of the mold plate and at least one non-recessed space running between the at least two cavities, wherein the at least one non-recessed space is co-planar to the top side of the mold plate, and extends through an entire length of the mold plate;

(B) obtaining a high-temperature resist film;

(C) injecting a molten solder into the at least two cavities, wherein the injection occurs in an environment having an oxygen concentration which is higher than about 5 parts per million;

(D) cooling the molten solder to a temperature that is below about ½ of the solder's melting point to form a solidified solder;

(E) forming an oxide skin over a top of the solidified solder;

(F) dispensing flux over a top of the at least two cavities of the mold plate;

(G) inserting a spacer over a top of the mold plate;

(H) placing a layer of the high-temperature resist film over a top of the spacer, wherein the high-temperature resist film is unreactive with the molten solder; and (I) reflowing the solder to form at least two solder balls.

The height of the spacer is typically about ⅓ to about ¾ the diameter of each of the at least two solder balls, is more typically about ½ to about ⅔ the diameter of each of the at least two solder balls, and is most typically about ½ the diameter of each of the at least two solder balls.

After the layer of high-temperature resist film is placed over the top of the spacer, and before reflow, either a clamp or a coverplate may be used to fix the position of the high-temperature resist film in place. If a coverplate is used, the coverplate need not comprise any recesses. The high-temperature resist film is usually a polyimide film, a polytetrafluoroethylene film such as Teflon® film, or a polyphenylene ether film.

Reflow occurs in an oxide-reducing environment at temperatures above the solder melting point, and, in this aspect of the disclosure, is accomplished using a liquid flux. The shape of each of the cavities of the mold plate is typically round, hemispherical, pyramidal, cubic, hexahedron, octagonal, or cross-shaped. The mold plate is usually formed from a glass, metal, graphite, silicon, ceramic, or polymer material.

Furthermore, this aspect of the present disclosure may further comprise:

(A) removing a flux residue from an outside of the at least two solder balls;

(B) removing the high-temperature resist film from the top of the mold plate; and (C) removing the at least two solder balls from the at least two cavities of the mold plate.

The flux residue is created during reflow and may be removed by using capillary action to infuse a solvent through the space between the top side of the mold plate and the underside of the layer of high-temperature resist film that is created by the spacer, and contacting the flux residue with the solvent. In this aspect of the disclosure, the flux residue is removed after reflow occurs but before the high-temperature resist film and/or coverplate/clamp is/are separated from the mold plate. Thus, the solder balls are retained in the cavities during removal of the flux residue.

Lastly, a sixth aspect of the present disclosure is a method of preventing or reducing bridging of two or more solder balls during an injection molded soldering process comprising:

(A) obtaining a mold plate comprising at least two cavities on a top side of the mold plate, and at least one non-recessed space running between the at least two cavities, wherein the at least one non-recessed space is co-planar to the top side of the mold plate, and extends through an entire length of the mold plate;

(B) obtaining a high-temperature resist film;

(C) injecting a molten solder into the at least two cavities, wherein the injection occurs in an $N_2$ environment having an oxygen concentration of less than about 2 parts per million;

(D) cooling the molten solder to a temperature that is below about ½ of the solder's melting point to form a solidified solder;

(E) inserting a spacer over a top of the mold plate;

(F) placing a layer of a high-temperature resist film over a top of the at least two cavities of the mold plate, wherein the high-temperature resist film is unreactive with the molten solder; and (G) reflowing the solder to form at least two solder balls, wherein the reflowing is performed in a formic acid vapor phase flux.

The height of the spacer is typically about ⅓ to about ¾ the diameter of each of the at least two solder balls, is more typically about ½ to about ⅔ the diameter of each of the at least two solder balls, and is most typically about ½ the diameter of each of the at least two solder balls.

After the layer of high-temperature resist film is placed over the top of the spacer, and before reflow, either a clamp or a coverplate may be used to fix the position of the high-temperature resist film in place. If a coverplate is used, the coverplate need not comprise any recesses. The high-temperature resist film is usually a polyimide film, a polytetrafluoroethylene film such as Teflon® film, or a polyphenylene ether film.

Reflow occurs in an oxide-reducing environment at temperatures above the solder melting point, and, in this aspect of the disclosure, is accomplished using a gaseous flux. The shape of each of the cavities of the mold plate is typically round, hemispherical, pyramidal, cubic, hexahedron, octagonal, or cross-shaped. The mold plate is usually formed from a glass, metal, graphite, silicon, ceramic, or polymer material.

Furthermore, this aspect of the present disclosure may further comprise:

(A) removing the high-temperature resist film from the top of the mold plate; and (B) removing the at least two solder balls from the at least two cavities of the mold plate.

BRIEF DESCRIPTION OF THE DRAWINGS

FIG. 7A shows the flux plate apparatus before reflow occurs, and FIG. 7B illustrates the flux plate apparatus after reflow is completed and the flux has been removed from the recesses of the flux plate.

FIG. 9A shows the apparatus (through a side-view) after molten solder has been injected into the cavities, and FIG. 9B illustrates the apparatus (through a side-view) after the solder has been reflowed to form solder balls.

FIG. 10A shows the apparatus (through a side-view) after molten solder has been injected into the cavities, and FIG. 10B illustrates the apparatus (through a side-view) after the solder has been reflowed to form solder balls.

DESCRIPTION OF BEST AND VARIOUS EMBODIMENTS OF DISCLOSURE

Figure 1:
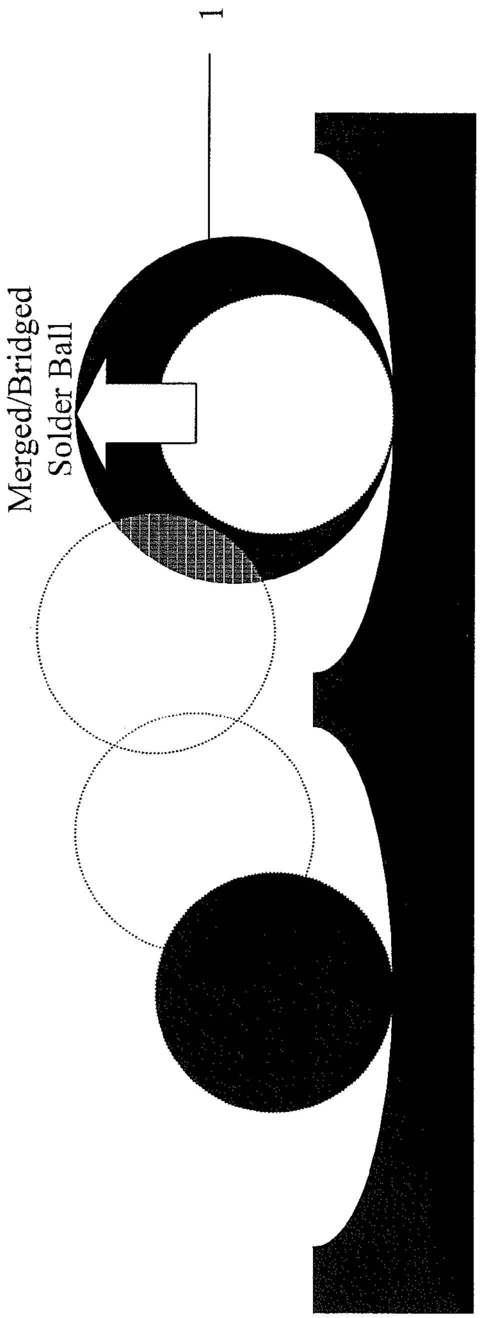
FIG. 1 demonstrates a solder ball produced by an injection molding soldering (IMS) method, wherein merging of the solder balls occurred during reflow.

The present disclosure, which is directed to several injection molding soldering (IMS) methods of making solder balls, will now be described in greater detail by referring to the drawings that accompany the present application. Injection molding soldering refers to the method in which molten solder is injected into mold cavities and the solder is then reflowed to form solder balls. It is noted that in the accompanying drawings, like reference numerals are used for describing like and/or corresponding elements.

The IMS methods of the instant disclosure produce solder balls having a uniform size by preventing and/or reducing bridging or merging of the balls. FIG. 1 illustrates an example of a solder ball 1 produced by an IMS method, wherein merging occurred and solder balls of various sizes were produced. The solder balls made according to these methods must be sifted after reflow in order to obtain several balls having uniform size. The IMS methods of the present disclosure prevent and/or reduce merging of solder balls, and therefore eliminate the undesirable sifting step required by many other IMS methods.

The term “solder ball,” as used in the present disclosure, refers to a ball of solder material made according to the processes disclosed herein. The term solder ball includes material in any phase, including material that is in the solid or molten state. “Solder ball” also refers to a ball of solder material that is spherical or substantially spherical in shape. Solder balls of the instant disclosure usually have a diameter of about 25 microns to about 500 microns, and more typically from about 50 microns to about 150 microns.

Solder balls of the instant disclosure may be formed from solder materials comprising Sn, Pb, as well as alloys of Sn or Pb such as, SnPb, SnCu, SnAg, SnAgCu, SnCuBi, and SnAgCuBi. Typically, Sn63Pb37, Pb97Sn3 are used as leaded solders, and SnCu0.7, SnAg3.5, SnAg3.8Cu0.7 are used as non-leaded solders. These materials are usually present in a substantially pure form, wherein the material is essentially free of other materials such as solder paste.

Figure 2:
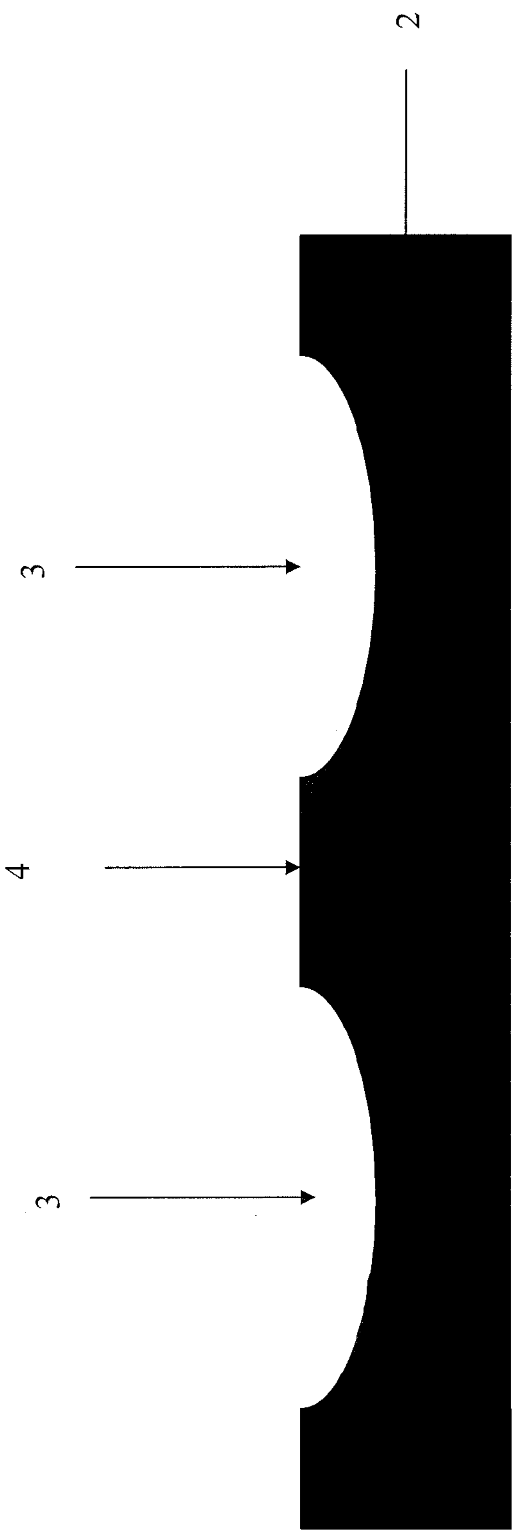
FIG. 2 is a pictorial representation (through a side-view) of a mold plate used in the IMS methods of the present disclosure.

FIG. 2 illustrates an example of a mold plate 2 that may be utilized in the IMS methods of the present disclosure. The mold plate 2 comprises at least two cavities 3 in which the solder material (such as one or more of the materials listed above) is deposited, and at least one non-recessed space 4 running between the at least two cavities 3.

The at least two cavities 3 may be any shape, and are typically etched into the mold plate 2 using, for example, a precision etching process, such as an isotropic etching process. The diameter of each cavity typically ranges from about 25 microns to about 500 microns, and more typically ranges from about 50 microns to about 150 microns. Depending on the etching process used to form the cavities, the depth to diameter aspect ratio of the cavities can, for example, range from about ¼ to about ½.

The arrangement of cavities 3 in the mold plate 2 is also not limited. For example, the cavities may be arranged in a manner that mirrors the arrangement of solder receiving pads on a final substrate or wafer. Alternatively, the solder balls may be formed in a different configuration (e.g., a more densely packed configuration) than that in which they are finally arrayed. The cavities may also be arranged in an array in which they are evenly spaced in one or more dimensions (e.g., a two-dimensional array of evenly spaced cavities).

The mold plate 2 may be formed from materials such as glass, metal, graphite, silicon, and/or polymer materials such as polyimide sheets. For instance, when the cavities 3 are round or hemispherical in shape, a glass or metal mold plate or sheet is more typically used. When pyramidal cavities are used, a silicon mold plate is more typically used, and the pyramidal shape is usually produced by anisotropic etching in <100> silicon wafers.

Figure 3:
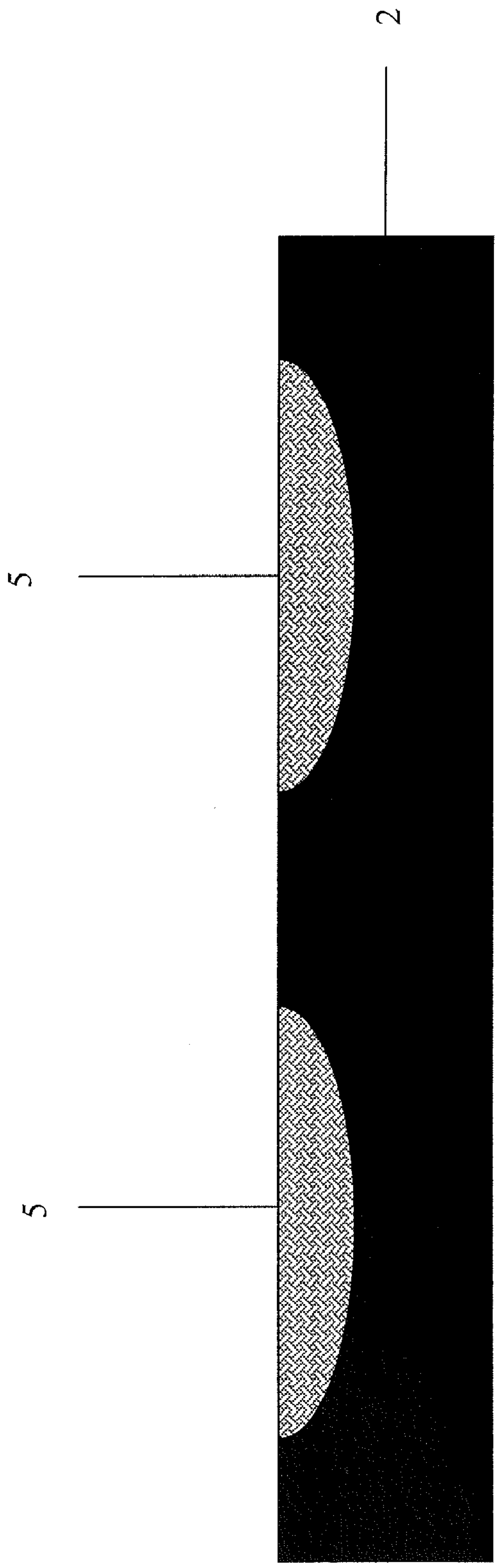
FIG. 3 is a pictorial representation (through a side-view) of the mold plate of the present disclosure after the molten solder has been injected into the at least two cavities.

The at least one non-recessed space 4 is co-planar to the top side of the mold plate 2, and extends through an entire length of the mold plate 2. As a result of the IMS process, the cavities 3 of the mold plate 2 are filled with the molten solder material 5 as shown, for example, in FIG. 3. After the cavities 3 of the mold plate 2 are filled, the molten solder material 5 is cooled to form a solidified solder material.

Figure 4:
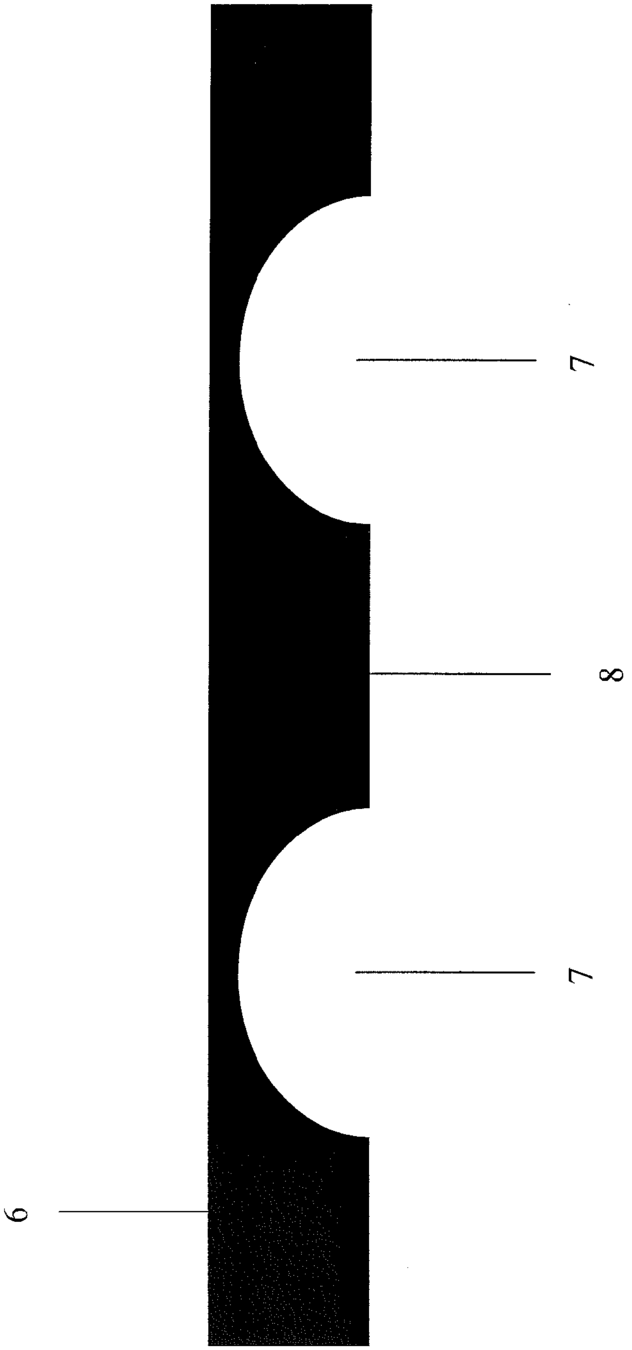
FIG. 4 is a pictorial representation (through a side-view) of a coverplate used in some of the IMS methods of the present disclosure. The depicted coverplate is an example of a cavity-scale coverplate and could be used in, for example, methods of the first and second aspects of the present disclosure.

FIG. 4 demonstrates an example of a cavity-scale coverplate 6 that is used in the first and second aspects of the IMS methods of the instant disclosure. The cavity-scale coverplates 6 of the instant disclosure comprise at least two recesses 7 which each cover one cavity 3 of the mold plate 2. The coverplates further comprise at least one non-recessed space 8 that runs between the at least two recesses 7.

Figure 5:
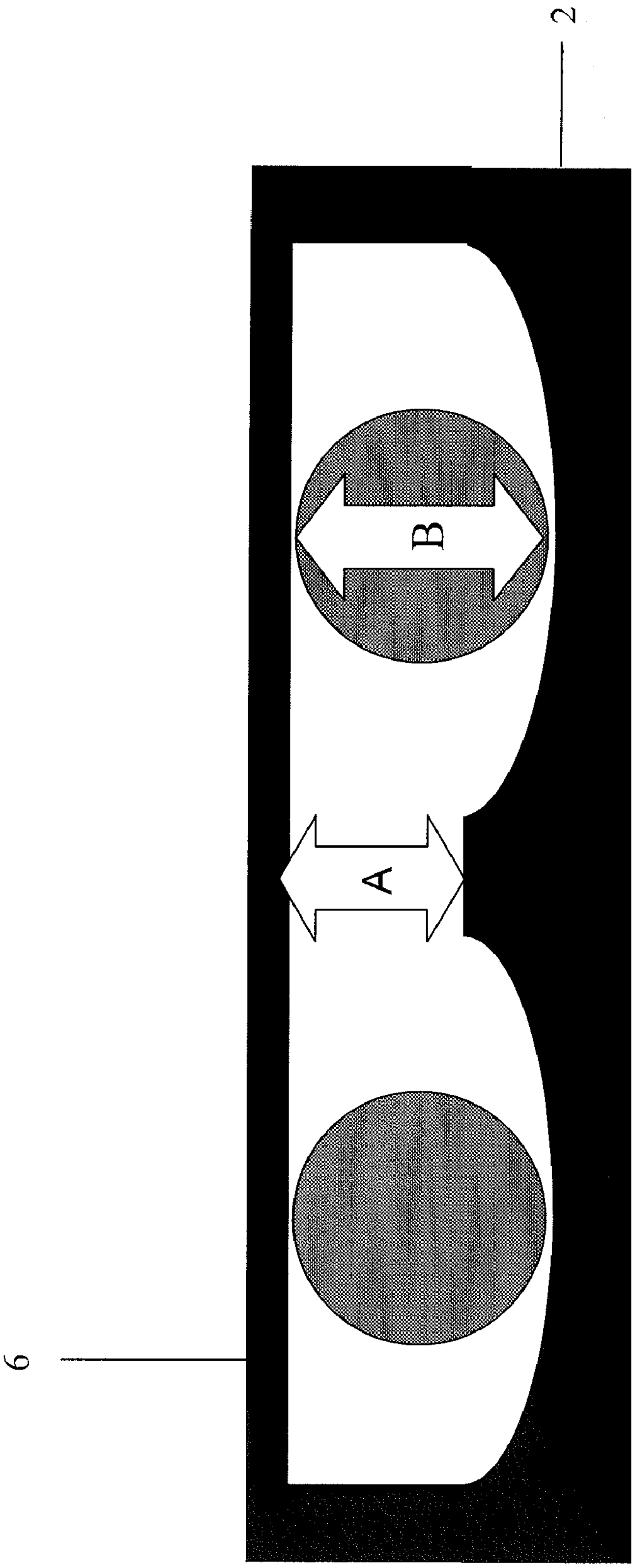
FIG. 5 is a pictorial representation (through a side-view) of the gap that is formed between the top side of the mold plate and the underside of the coverplate after the single recess of the coverplate is positioned over the top of the at least two cavities of the mold plate, and the recess of the coverplate is aligned, at the matrix scale, with the cavities of the mold plate.

When a coverplate, such as the coverplate 6, is employed in the methods of the instant disclosure, a gap A is formed between a top of the mold plate 2 and the underside of the coverplate. The gap is formed, for instance, by positioning the at least two recesses 7 of the coverplate 6 over a top of the at least two cavities 3 of the mold plate 2 and aligning the recesses 7 of the coverplate 6, at the cavity scale, with the cavities 3 of the mold plate 2. As demonstrated in FIG. 5, which shows a matrix-scale coverplate, the height of the gap A is substantially smaller than the diameter B of each of the solder balls formed by the IMS methods of the instant disclosure, thus making it impossible for the reflowed solder balls to bridge through gap A. The height of the gap A is typically about ⅓ to about ¾ of a diameter B of each of the at least two solder balls, is more typically about ½-⅔ of a diameter B of each of the at least two solder balls, and is most typically about ½ of a diameter B of each of the at least two solder balls.

Figure 6:
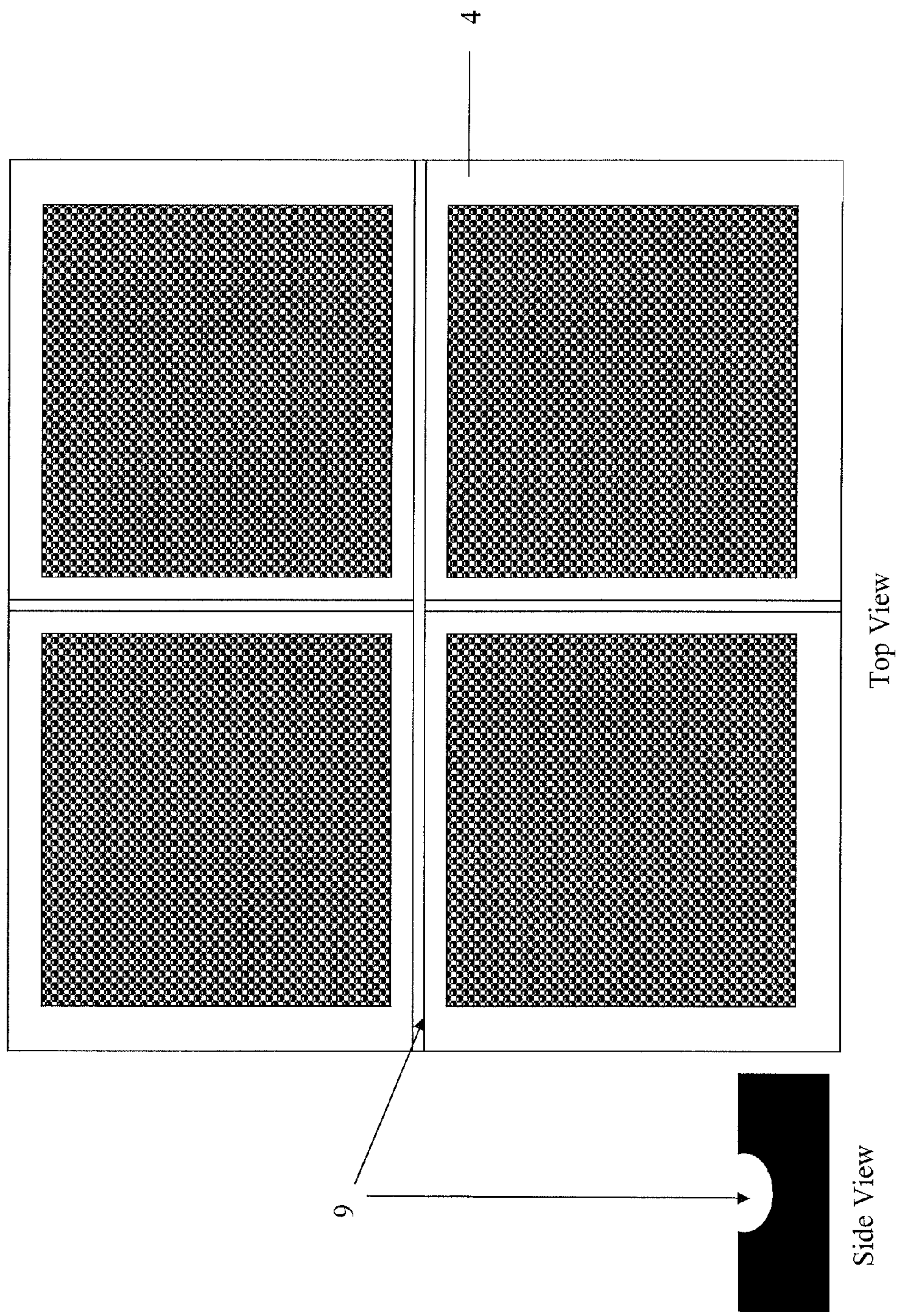
FIG. 6 is a pictorial representation (through both top and side views) of the gas vent channel that may be present in the mold plates and/or coverplates used in the IMS methods of the instant disclosure.

The coverplates and/or mold plates of the instant disclosure may also comprise a gas vent channel 9 that extends through a middle of the non-recessed space 4 running between the at least two cavities 3 and/or the at least two recesses 7. FIG. 6 is a pictorial representation of both a top and side view of one aspect of the present disclosure, wherein the gas vent channel 9 extends through a middle of the non-recessed space 4 that runs between arrays of cavities 3 in the mold plate 2. The gas vent channel 9 extends through the entire length of the mold plate 2, enabling venting of any gas that may form during the solder reflow using flux. Gas vent channels have a width that is typically 2-10 times the diameter of each of the cavities of the mold plate and/or the diameter of each of the recesses of the coverplate, and typically have a depth that is 5-15 times the depth of each of the cavities of the mold plate and/or the depth of each of the recesses of the coverplate.

Figure 7:
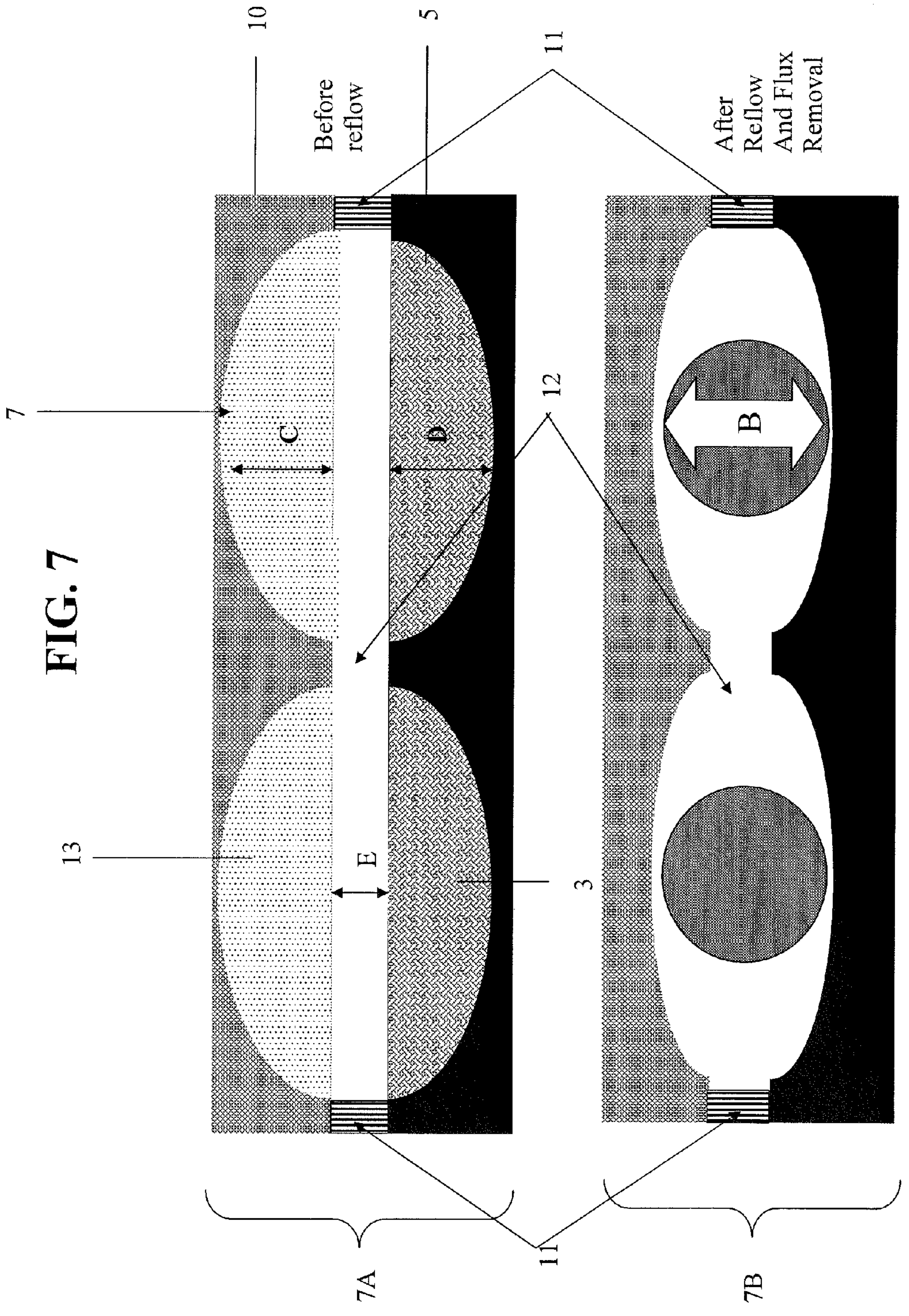
FIG. 7 is a pictorial representation (through a side-view) of the aspect of the present disclosure wherein the coverplate is a flux plate.

FIG. 7 demonstrates a further aspect of the present disclosure, wherein the coverplate is a flux plate 10 comprising recesses 7 having a depth C that is approximately equal to a depth D of the cavities 3 of the mold plate. In this aspect of the disclosure, a spacer 11 is used to form a solvent access gap 12 between the top side of the mold plate and the underside of the flux plate 10. The height E of the solvent access gap 12 is typically about ⅓ to about ¾ of a diameter B of each of the at least two solder balls, is more typically about ½-⅔ of a diameter B of each of the at least two solder balls, and is most typically about ½ of a diameter B of each of the at least two solder balls. Before the solvent access gap 12 is formed, the recesses 7 are filled with flux 13.

Figure 8:
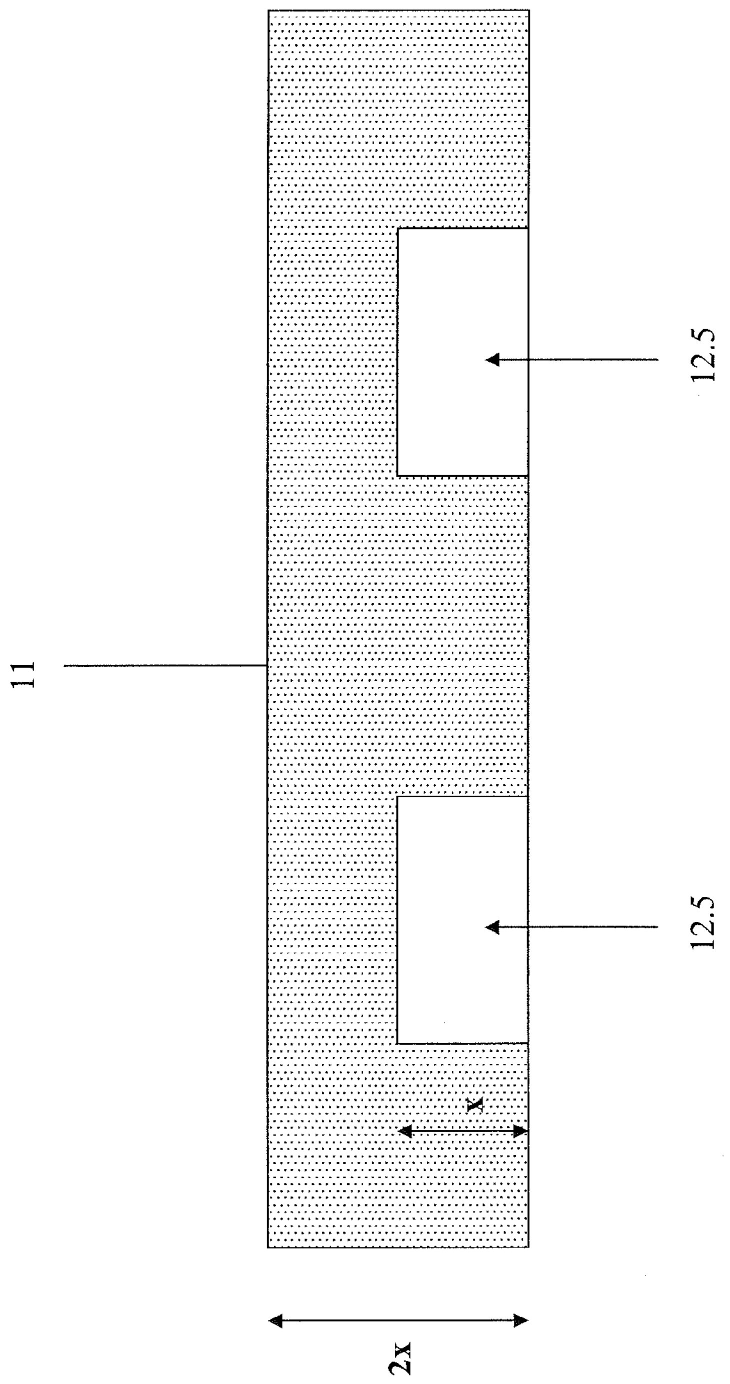
FIG. 8 is a pictorial representation (through a side-view) of the spacer, which has solvent-entry openings, that is used to form a solvent access gap between the top side of the mold plate and the underside of the flux plate/coverplate in some of the IMS methods of the instant disclosure.

FIG. 8 provides further detail of the spacer 11 that is used to form a solvent access gap between the top side of the mold plate and the underside of the flux plate or coverplate. The spacer 11 also provides solvent-entry openings 12.5. The spacer 11 has a height (2x) that is approximately twice as large as the height (x) of the solvent-entry openings 12.5. The spacers 11 permit entry of the flux solvents into the solvent access gap 12, and, in smaller assemblies, may be positioned around the periphery of the entire mold, between the top of the mold and the bottom of the coverplate; or between cavity arrays in larger assemblies.

Figure 9:
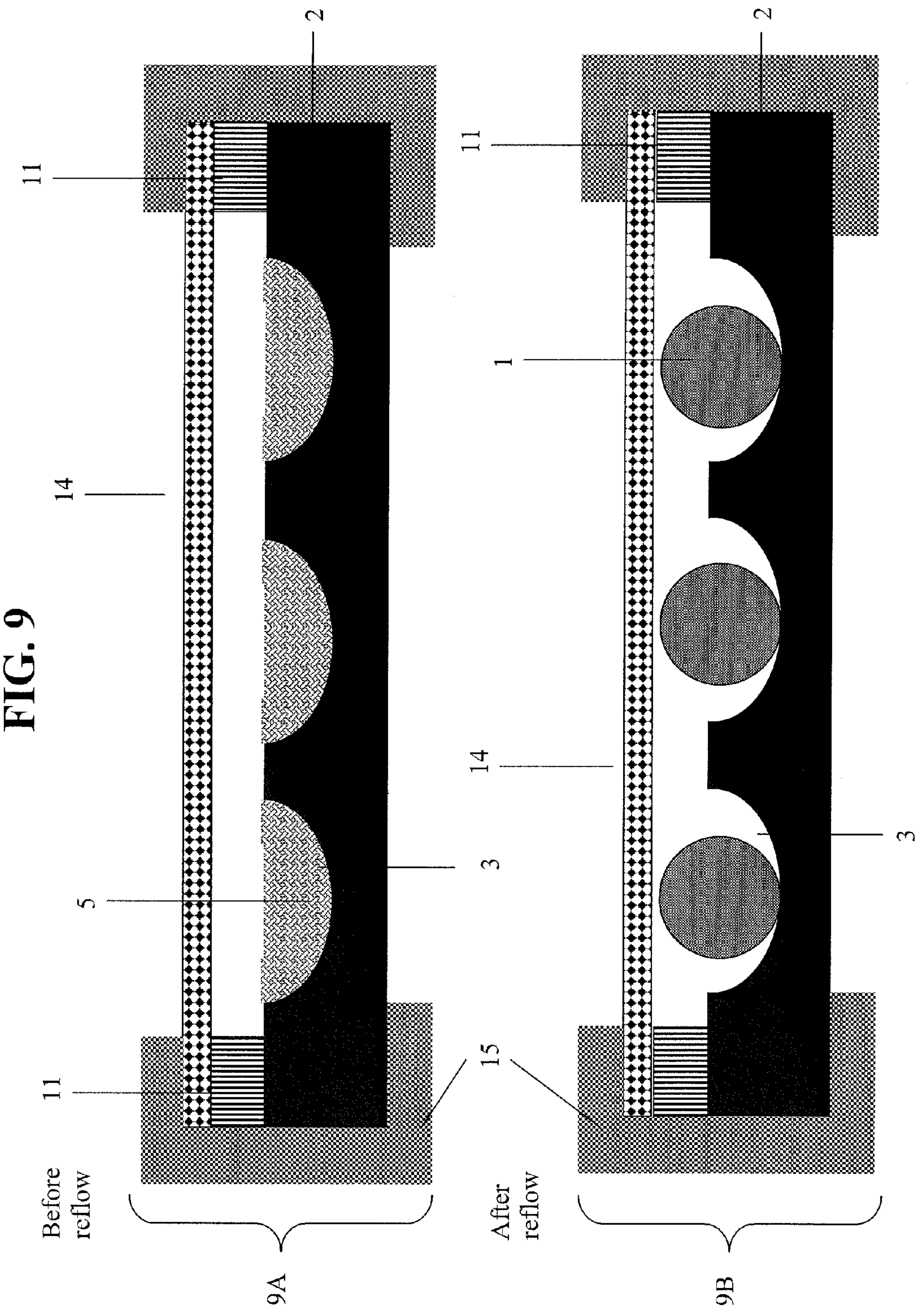
FIG. 9 is a pictorial representation (through a side-view) of an apparatus that may be used in the fifth and sixth aspects of the disclosure that employ a high-temperature resist film and use a clamp to fix the position of the high-temperature resist film over the spacer.
Figure 10:
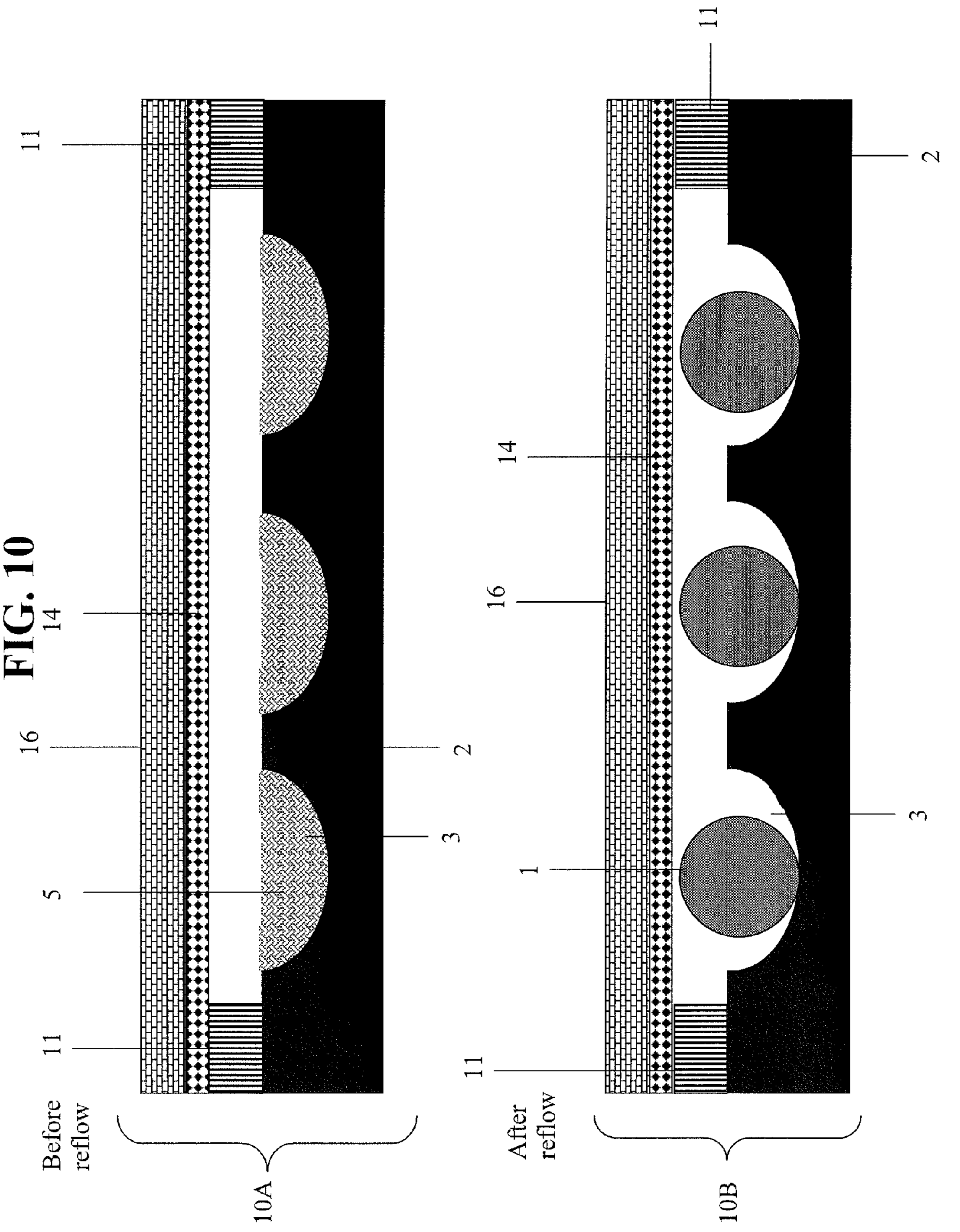
FIG. 10 is a pictorial representation (through a side-view) of an apparatus that may be used in the fifth and sixth aspects of the disclosure that employ a high-temperature resist film and uses a coverplate to fix the position of the high-temperature resist film over the spacer.

The fifth and sixth aspects of the IMS methods of the instant disclosure employ a high temperature resist film 14, shown, for example, in FIG. 9, that is placed over the cavities of the mold plate before reflow occurs. In one aspect of the disclosure, the molten solder 5 is injected into the at least two cavities 3 in an $N_2$ environment having an oxygen concentration of less than about 2 parts per million as illustrated in FIG. 9A. After the molten solder 5 is injected, the high-temperature resist film 14 is placed over the top of the cavities 3 and spacer 11 of the mold plate 2. The molten solder 5 is then cooled to form a solidified solder. The resulting solidified solder does not have an oxide skin over the top of it. After the molten solder is cooled, either a clamp 15 or a coverplate 16 may be used to fix the position of the high-temperature resist film 14 on the spacer 11 during reflow. FIG. 9 shows an apparatus of the instant disclosure wherein a clamp 15 is used to secure the position of the high-temperature resist film 14. Furthermore, FIG. 9B demonstrates the apparatus of the instant disclosure after reflow has occurred and solder balls 1 have been formed. FIG. 10 shows the apparatus of the instant disclosure wherein a coverplate 16 is used to secure the position of the high-temperature resist film 14. FIG. 10A shows the apparatus after the molten solder 5 has been injected into the at least two cavities 3, and FIG. 10B shows the apparatus after reflow has occurred and solder balls 1 have been formed.

Next, the solidified solder is reflowed in a formic acid vapor phase flux, or other oxide-reducing environment, to form solder balls. For instance, if the solder material used is a higher temperature Pb97Sn3 alloy, then reflowing in hydrogen is possible because the environment has oxide-reducing properties above about 300° C. On the other hand, if the solder material is an Sn63Pb37 alloy, such as standard Sn63Pb37 with a melting temperature of about 183° C., or a lead-free alloy such as SnCu0.7, such as a common SnCu0.7 alloy with a melting temperature of about 227° C., then liquid flux or formic acid vapor environments may be used for reflow.

The term "high temperature resist film," as used herein, usually refers to a polyimide film, a polytetrafluoroethylene film such as Teflon® film, or a polyphenylene ether film that does not react with the molten solder. Other high temperature resist films that are unreactive with molten solder, however, are also contemplated by the instant disclosure.

The temperature of the solder material during various stages of the processes of the instant disclosure depends on the specific solder material or materials used. For example, standard eutectic SnPb solder has a melting point of about 183° C., a lead-free alloy such as standard SnCu has a melting point of about 227° C., and standard high lead PbSn3 has a melting point of about 323° C. Processing temperatures are typically kept about 20° C. above the melting point for both cavity filling as well as reflow.

At least one aspect of the present disclosure may overcome at least one deficiency associated with prior injection molding soldering processes. In particular, the methods of the instant disclosure provide uniformly sized solder balls without requiring a sifting step after reflow. In addition, the solder balls of the instant disclosure, which are made without the use of solder paste, have relatively few voids and, as a result, may be expected to have better overall mechanical properties than solder balls produced using solder paste.

Still other objects and advantages of the present disclosure will become readily apparent by those skilled in the art from the preceding detailed description, wherein it is shown and described in preferred embodiments, simply by way of illustration of the best mode contemplated. As will be realized the disclosure is capable of other and different embodiments, and its several details are capable of modifications in various obvious respects, without departing from the disclosure. Accordingly, the description is to be regarded as illustrative in nature and not as restrictive.

The term "comprising" (and its grammatical variations) as used herein is used in the inclusive sense of "having" or "including" and not in the exclusive sense of "consisting only of." The term "consisting essentially of" as used herein is intended to refer to including that which is explicitly recited along with what does not materially affect the basic and novel characteristics of that recited or specified. The terms "a" and "the" as used herein are understood to encompass the plural as well as the singular.

What is claimed is:

1. A method of preventing or reducing bridging of two or more solder balls during an injection molded soldering process comprising:

(A) obtaining a mold plate comprising at least two cavities on a top side of the mold plate, and at least one non-recessed space running between the at least two cavities, wherein the at least one non-recessed space is co-planar to the top side of the mold plate, and extends through an entire length of the mold plate;

(B) obtaining a coverplate comprising at least two recesses on an underside of the coverplate, and at least one non-recessed space running between the at least two recesses, wherein the at least one non-recessed space is co-planer to the underside of the coverplate, and extends through an entire length of the coverplate;

(C) filling the at least two cavities with a molten solder;

(D) cooling the molten solder to a temperature that is below about ½ of the solder's melting point to form a solidified solder;

(E) forming a gap between a top of the mold plate and the underside of the coverplate by positioning the at least two recesses of the coverplate over a top of the at least two cavities of the mold plate and aligning the recesses of the coverplate, at the cavity scale, with the cavities of the mold plate; and (F) reflowing the solidified solder in an oxide-reducing environment to form at least two solder balls, wherein a height of the gap is about ⅓ to about ¾ of a diameter of each of the at least two solder balls.

2. The method of claim 1, wherein each of the at least two cavities of the mold plate have a round, hemispherical, pyramidal, cubic, hexahedron, octagonal, or cross shape.

3. The method of claim 1, wherein the mold plate comprises at least one of a glass, metal, graphite, silicon, ceramic, or polymer material.

4. The method of claim 1, wherein the mold plate and/or the coverplate further comprise at least one gas vent channel extending through a middle of the non-recessed space running between the at least two cavities and/or the at least two recesses, and wherein the at least one gas vent channel extends through the entire length of the mold plate and/or coverplate.

5. The method of claim 1, wherein:

(A) the at least two cavities have a uniform depth; and (B) the coverplate is a flux plate comprising at least two recesses on an underside of the flux plate, and wherein a depth of the at least two recesses is approximately equivalent to the depth of the at least two cavities of the mold plate, and wherein the method further comprises:

(A) filling the at least two recesses in the underside of the coverplate with flux after the molten solder is cooled; and then (B) forming a solvent access gap between a top of the mold plate and the underside of the coverplate by placing a spacer between the top side of the mold plate and the underside of the coverplate and then aligning the recesses of the coverplate, at the cavity scale, with the cavities of the mold plate, wherein a height of the spacer is about ⅓ to about ¾ of a diameter of each of the at least two solder balls.

6. The method of claim 5, wherein each of the at least two cavities of the mold plate has a round, hemispherical, pyramidal cubic, hexahedron, octagonal, or cross shape.

7. The method of claim 5, wherein the mold plate comprises at least one of: a glass, metal, graphite, silicon, ceramic or polymer material.

8. The method of claim 5, further comprising removing a flux residue formed in the at least two cavities of the mold plate after reflowing, by infusing a solvent through the solvent access gap by capillary action and contacting the flux residue with the solvent.

9. A method of preventing or reducing bridging of two or more solder balls during an injection molded soldering process comprising:

(A) obtaining a mold plate comprising at least two cavities on a top side of the mold plate, and at least one non-recessed space running between the at least two cavities, wherein the at least one non-recessed space is co-planar to the top side of the mold plate, and extends through an entire length of the mold plate;

(B) obtaining a coverplate comprising at least one recess on an underside of the coverplate, wherein the recess is sufficiently large to cover more than one of the at least two cavities of the mold plate and the non-recessed space between the at least two cavities;

(C) filling the at least two cavities with a molten solder;

(D) cooling the molten solder to a temperature that is below about ½ of the solder's melting point to form a solidified solder;

(E) forming a gap between a top of the mold plate and the underside of the coverplate by positioning the at least one recess of the coverplate over a top of the at least two cavities of the mold plate and aligning the recesses of the coverplate, at the matrix scale, with the cavities of the mold plate; and (E) reflowing the solidified solder to at least two solder balls, wherein a height of the gap is about ⅓ to about ¾ of a diameter of each of the at least two solder balls.

10. The method of claim 9, wherein each of the at least two cavities of the mold plate have a round, hemispherical, pyramidal, cubic, hexahedron, octagonal, or cross shape.

11. The method of claim 9, wherein the mold plate comprises at least one of: a glass, metal, graphite, silicon, ceramic or polymer material.

12. The method of claim 9, wherein the mold plate further comprises at least one gas vent channel extending through a middle of the non-recessed space between the at least two cavities of the mold plate, and wherein the at least one gas vent channel extends through the entire length of the mold plate.

13. The method of claim 9, wherein:

(A) the at least two cavities have a uniform depth; and (B) the coverplate is a flux plate comprising at least one recess on an underside of the flux plate, and wherein a depth of the at least one recess is approximately equivalent to the depth of the at least two cavities of the mold plate, and wherein the method further comprises:

(C) filling the at least one recess in the underside of the coverplate with flux after the molten solder is cooled; and then (D) forming a solvent access gap between a top of the mold plate and the underside of the coverplate by placing a spacer between the top side of the mold plate and the underside of the coverplate and then aligning the recess of the coverplate, at the matrix scale, with the cavities of the mold plate, wherein a height of the spacer is about ⅓ to about ¾ of a diameter of each of the at least two solder balls.

14. The method of claim 13, wherein each of the at least two cavities of the mold plate has a round, hemispherical, pyramidal cubic, hexahedron, octagonal, or cross shape.

15. The method of claim 13, wherein the mold plate comprises at least one of: a glass, metal, graphite, silicon, ceramic or polymer material.

16. The method of claim 13, further comprising removing a flux residue formed in the at least two cavities of the mold plate after reflowing, by infusing a solvent through the solvent access gap by capillary action and contacting the flux residue with the solvent.

* * * * *